(12) United States Patent
Ravary et al.

(10) Patent No.: US 11,830,712 B2
(45) Date of Patent: Nov. 28, 2023

(54) HIGH EFFICIENCY ROTATABLE SPUTTER TARGET

(71) Applicant: SCI ENGINEERED MATERIALS, INC., Columbus, OH (US)

(72) Inventors: Ian Ravary, Columbus, OH (US); Jeremy Young, Gahanna, OH (US)

(73) Assignee: SCI ENGINEERED MATERIALS, INC., Columbus, OH (US)

( * ) Notice: Subject to any disclaimer, the term of this patent is extended or adjusted under 35 U.S.C. 154(b) by 96 days.

(21) Appl. No.: 17/608,683

(22) PCT Filed: Apr. 24, 2020

(86) PCT No.: PCT/US2020/029736
§ 371 (c)(1),
(2) Date: Nov. 3, 2021

(87) PCT Pub. No.: WO2020/236396
PCT Pub. Date: Nov. 26, 2020

(65) Prior Publication Data
US 2022/0216041 A1 Jul. 7, 2022

Related U.S. Application Data

(60) Provisional application No. 62/851,422, filed on May 22, 2019.

(51) Int. Cl.
| | | |
|---|---|---|
| *H01J 37/34* | (2006.01) |
| *C03C 17/245* | (2006.01) |
| *C23C 14/08* | (2006.01) |
| *C23C 14/34* | (2006.01) |

(52) U.S. Cl.
CPC ........ *H01J 37/3429* (2013.01); *C03C 17/245* (2013.01); *C23C 14/086* (2013.01);
(Continued)

(58) Field of Classification Search
CPC .............. H01J 37/3429; H01J 37/3417; H01J 37/3426; H01J 37/3435; H01J 37/3497;
(Continued)

(56) References Cited

U.S. PATENT DOCUMENTS

| | | | |
|---|---|---|---|
| 2003/0136672 A1 | 7/2003 | Barrett | |
| 2006/0065524 A1* | 3/2006 | Newcomb | C23C 14/3407 204/298.26 |
| 2006/0266643 A1* | 11/2006 | Le | C23C 14/3407 204/298.12 |
| 2007/0074969 A1 | 4/2007 | Simpson et al. | |

(Continued)

FOREIGN PATENT DOCUMENTS

| | | | |
|---|---|---|---|
| CN | 107663630 | * | 2/2018 |
| CN | 108570652 | * | 9/2018 |

(Continued)

OTHER PUBLICATIONS

Machine Translation CN 108570652 (Year: 2018).*
Machine Translation KR 20150061185 (Year: 2015).*
Machine Translation CN 107663630 (Year: 2018).*

*Primary Examiner* — Rodney G McDonald
(74) *Attorney, Agent, or Firm* — Hudak, Shunk & Farine Co. LPA

(57) ABSTRACT

A rotatable sputtering target is provided for use in a sputtering system having a plurality of hollow sleeves of sputtering material arranged on a hollow e backing tube so as to form an annular space that is occupied by a bonding agent and a thermally conductive element which is a woven metal mesh.

18 Claims, 7 Drawing Sheets

(52) U.S. Cl.
CPC ...... *C23C 14/3407* (2013.01); *H01J 37/3417* (2013.01); *C03C 2217/216* (2013.01); *C03C 2217/24* (2013.01); *C03C 2218/154* (2013.01); *H01J 2237/332* (2013.01)

(58) Field of Classification Search
CPC ............ H01J 37/3423; H01J 2237/332; C23C 14/086; C23C 14/3407; C23C 14/3414; C03C 17/245; C03C 2217/216; C03C 2217/24; C03C 2218/154; B23P 11/00
USPC ........................................ 204/298.12, 298.21
See application file for complete search history.

(56) References Cited

U.S. PATENT DOCUMENTS

| | | | |
|---|---|---|---|
| 2007/0205101 A1* | 9/2007 | Ye | C23C 14/35 204/298.12 |
| 2011/0203921 A1* | 8/2011 | Ivanov | H01J 37/3405 204/298.12 |
| 2012/0006680 A1 | 1/2012 | Wityak et al. | |
| 2014/0124365 A1* | 5/2014 | Wurczinger | B23K 1/0016 228/256 |
| 2018/0051371 A1 | 2/2018 | Shin et al. | |
| 2020/0203134 A1 | 6/2020 | Wu | |

FOREIGN PATENT DOCUMENTS

| | | | |
|---|---|---|---|
| CN | 108570652 A | | 9/2018 |
| KR | 20150061185 | * | 6/2015 |

* cited by examiner

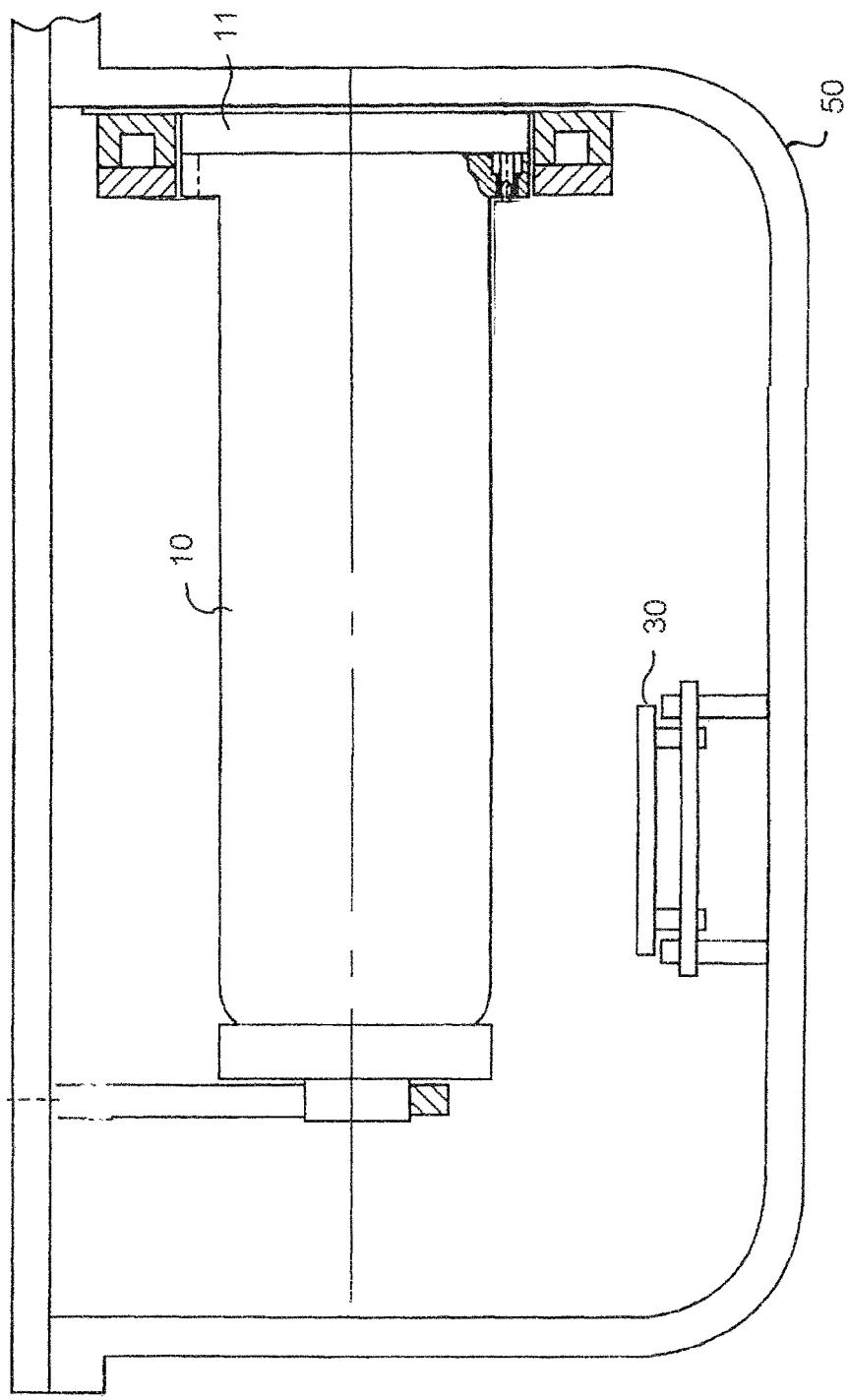

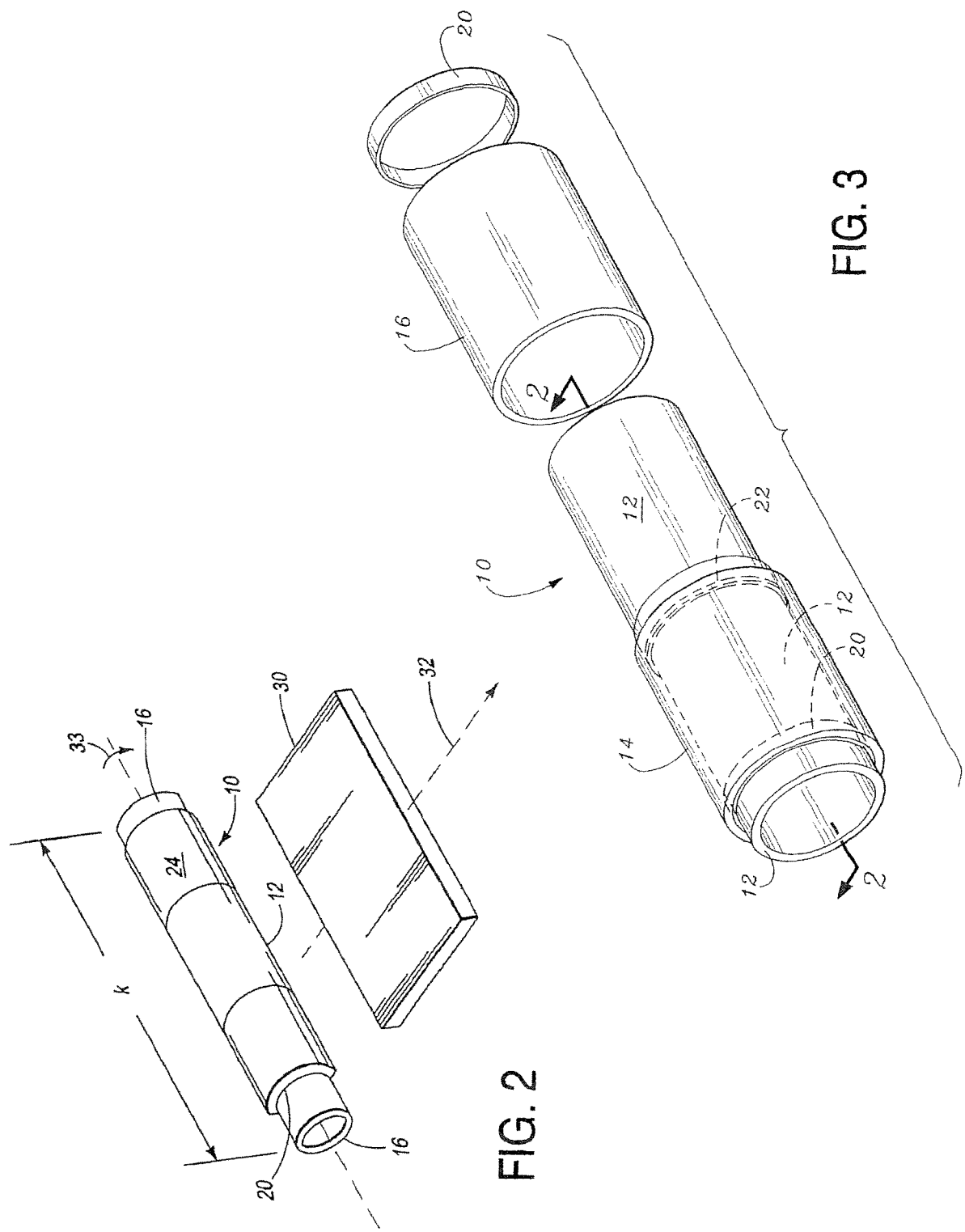

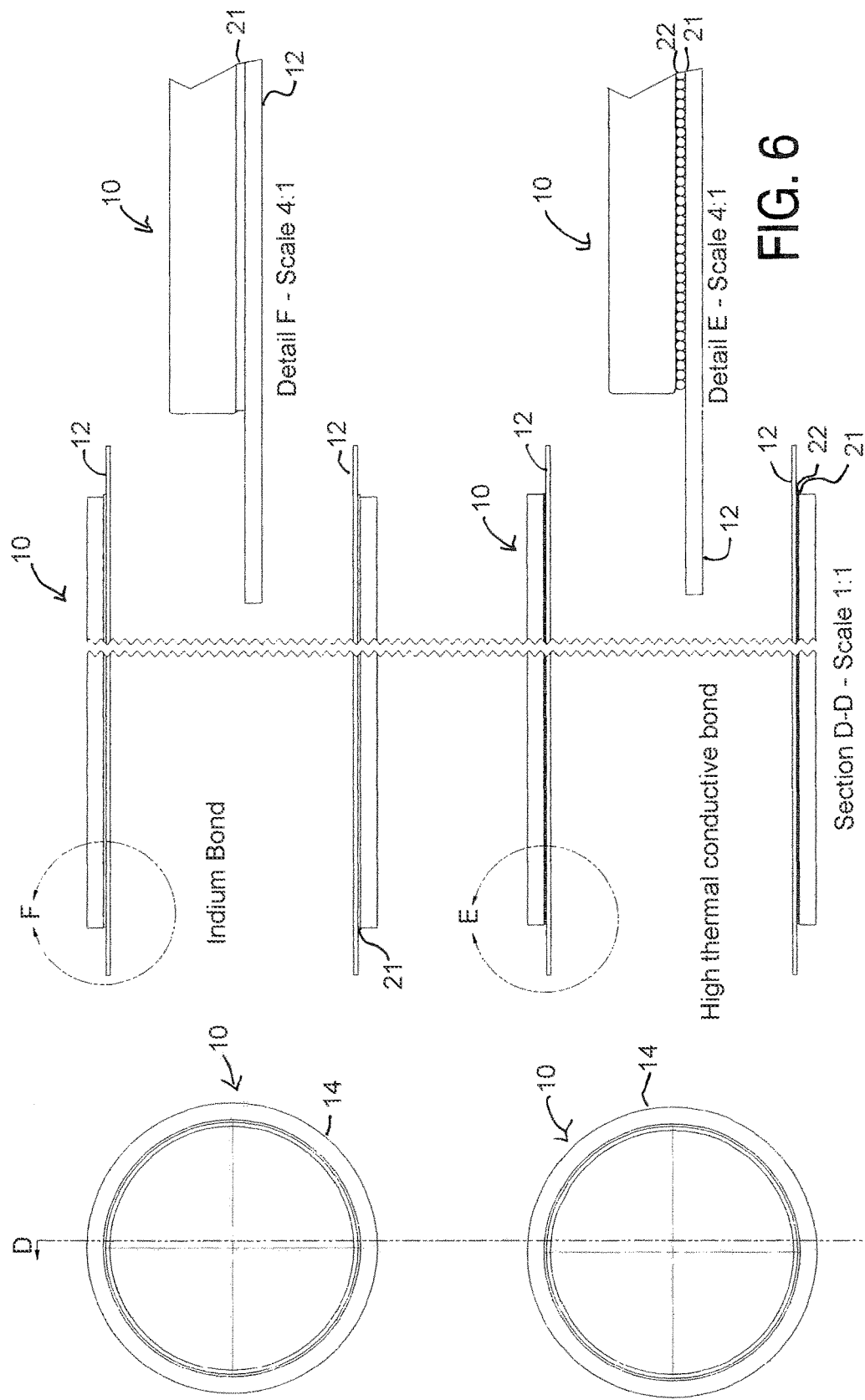

HIGH EFFICIENCY ROTATABLE SPUTTER TARGET

FIELD OF THE INVENTION

This invention relates to rotatable cylindrical sputtering targets used in PVD "Physical Vapor Deposition" processes for forming thin film coatings in particular for large surface area flat substrates, such as solar panels, displays, and architectural glass, and to methods for making and using these targets. More specifically, the invention concerns (1) methods for making rotatable sputter targets comprising a sputtering material, (2) to the resulting sputter targets, (3) to a sputtering system that utilizes the target; and (4) to a method of sputtering using the sputtering targets of the present invention.

BACKGROUND OF INVENTION

Sputtering is a manufacturing process used to create thin films by depositing a material in a vacuum from a "target" onto the surface of a desired substrate. The process involves the application of an electric current to the target which is typically also subjected to magnetic flux to create a plasma flow in a vacuum chamber so as to carry particles of the target to the substrate that is also placed within the vacuum chamber. While the process has been known and used, for example in the semi-conductor industry, for some time, it remains a complex phenomena, involving considerations of various forms of energy transfer, including electrical, and thermal conductance, as well as magnetic flux, and the interaction of these forces, and material considerations for the target material and resultant thin film.

During the sputtering process the coating or sputtering material is transported from a target or source containing that material to a substrate by bombarding the surface of the target with ions of an inert gas accelerated by a high voltage. As the gas ions hit the outside surface of the target, a portion of their kinetic energy is converted to heat while another portion of this energy is imparted by momentum transfer to the atoms of the sputtering material which thereby gain enough energy to overcome their bond to the target and escape the target surface. These atoms are carried across the sputtering chamber and are deposited on the substrate surface to form a thin film.

The sputtering process is carried out in an enclosed vacuum chamber filled with an inert sputtering gas and the target, which normally comprises the sputtering material deposited on or attached to a support, as well as the substrate and optionally means to apply a magnetic force to the target and means to drive the rotation of the target during use. The negative terminal of a power supply, usually DC Power is connected to the sputter target, which serves as a cathode, while the positive terminal is connected to the walls of the chamber. When the system is powered up, a negative surface charge is created on the surface of the target, thereby ejecting electrons from the sputtering material. These electrons collide with atoms of the sputtering gas to pull away electrons and create positively charged ions. The resulting combination of positively charged ions, electrons and neutral atoms is known as the sputtering gas plasma. The positively charged ions are accelerated toward the sputter target by the electrical potential between the sputtering gas plasma and the target and bombard the surface of the sputtering material carried by the target. As the ions impinge the sputtering material, atoms of the sputtering material are ejected from the target and coat the desired substrate within the sputtering chamber (which is typically under vacuum).

Frequently, this sputtering process is enhanced by placing magnets behind or near the sputtering material so as to create a magnetic flux which influences the path taken by electrons within the sputtering chamber, and consequently increases the frequency of collisions with sputtering gas atoms. Additional collisions create additional ions and further sustain the sputtering gas plasma. The apparatus employing this enhanced form of sputtering by using strategically placed magnets is known as a magnetron system.

A magnetron sputtering system can employ as its cathode either a planar, stationary sputter target or in particular for the present invention, an elongated cylindrical target that is rotatable around its longitudinal axis. A disadvantage of a planar cathode is that its surface tends to erode in a relatively narrow ring-shaped region corresponding to the shape of the closed loop magnetic field formed by the magnets (i.e., the "racetrack"). This results in a need for frequent replacement of the target. Also, it is difficult to carry out a continuous sputtering operation onto an elongated substrate, such as plate glass. The use of rotating, cylindrical sputter targets comprised of the sputtering material itself or a support tube or backing tube which supports the target material and comprises the cathode overcomes these problems and results in more effective utilization of the sputtering material. Such targets are rotated relative to the magnets to selectively bring different portions of the sputtering material on the outer surface of the target into sputtering position opposite the magnets in the sputtering chamber and to result in higher manufacturing efficiencies. Normally, a cooling fluid is passed through the center of the target to cool it as it is rotated using a rotational drive mechanism. The operation of rotatable sputtering targets (magnetrons) and their use in the sputtering process to coat substrates are described in more detail in U.S. Pat. Pub. Nos. 2003/0136672 and 2007/0074969, the disclosures of which patents are incorporated herein by reference.

Sputtering is used to deposit thin layers of aluminum on silicon wafers used to produce integrated circuits or to deposit decorative metals on plastic objects which are assembled into appliances or vehicles. A more recent use of PVD or sputtering, is for the formation of a functional coating on large planar surfaces for use in display, solar cells or commercial windows. Issues have resulted in the processes from the increase in scale that these applications require. For example, uniformity over a given dimension, and rate of deposition have introduced problems, such as how to manufacture a rotatable target at a longer length, (i.e., more than a meter), and which can function at higher operating energies to accommodate acceptable manufacturing efficiencies.

Methods used in the past to manufacture targets comprised of a support or backing tube on which the sputtering material has been deposited include plasma spraying, casting, flame spraying and electroplating. In some instances, functional ceramic materials are desirable target materials. Since certain morphologies and grain characteristics of these materials are necessary in the resulting targets, it is often necessary to manufacture smaller targets, including by cold or hot isostatic pressing, and to assemble the targets on a backing tube while taking into account the target to target interface so as to avoid areas that can arc or contaminate the deposition process.

SUMMARY OF THE INVENTION

In accordance with the invention, rotatable sputtering targets are assembled from a plurality of sputtering material cylinders stacked and bonded to a backing tube. The resultant cylindrical targets are over a meter, and typically from 1 to 2 or even 2.5 or 3 meters long, and include a ceramic target, such as a metal oxide including additional component materials, such as zinc, or indium in combination with aluminum or tin, and more specifically based on AZO or ITO. The backing tube is generally a conductive material formed into a hollow cylinder with assembled or integrated end blocks that serve to support the rotable targets and optionally allow for the targets to link to the drive and electrical circuit mechanisms.

Thus, the target of the present invention is formed by (1) preparing the outer surface of a backing tube for assembly into the cylindrical target first to ensure a clean suitable surface finish, and then by laying down an initial layer of bonding material by PVD or by applying a foil and adding heat and compression to the foil to adhere it to the backing tube, (2) forming a number of cylindrical target members, such as by sintering or isostatic pressing to an appropriate length as long as possible, such as 8-12 inches depending on the capability of the processing equipment and where the number of targets results in the desired length of rotatable target, (3) preparing the inner surface of the cylindrical target members by applying a layer of bonding material, such as by applying foil or PVD, (4) positioning the prepared backing tube in a vertical position for assembly, and sealing off the bottom end with a heat resistant seal and sealing the center of the backing tube to keep it from becoming contaminated with bonding material, (5) forming a thermal and electrically conductive member of a dimension to encircle the outer surface of the backing tube without overlap and placing the conductive member in position around the backing tube, (6) placing a first of the number of cylindrical targets on the backing tube and around the conductive element with a spacer and with bonding material to ensure that the annular space between the backing tube and the cylindrical target is radially symmetrical, and repeating this step until the assembled cylindrical targets have the desired target length, and (7) applying a heat to the assembly to bring it to a temperature at which the bonding material will flow, and then pouring molten bonding material into the annular void to bond the backing tube, conductive element and number of cylindrical targets into a single rotatable sputtering target in accordance with the present invention.

The bonding material is a thermally conductive material that flows at the fabrication temperature, which is normally the ambient temperature and usually ranges between about 150 (and more specifically 156° C. and about 250° C.). Further, during the step in which the backing tube is positioned, the annular space is sealed at or near the ends of the sleeve to inhibit the flowable material from escaping the annular space and during the assembly of the cylindrical targets on the backing tube, the areas between the cylindrical targets are also sealed so that the bonding material won't escape between the targets. Ideally, the material filling the annular space is both thermally and electrically conductive, and is indium, although it is envisioned that SN—Ag and Pb based solders and graphite filled epoxies, that cure into a solid adhesive and after the target has been fabricated, could also be used.

In one embodiment of the invention, the support tube is a non-magnetic stainless steel, the sleeve is a ceramic, such as aluminum zinc oxide or indium tin oxide or some combination of these, optionally including other dopant materials, the bonding material is an indium composition including pure indium, and alloys of indium or tin or lead such as indium/lead (30-80% to 80-30%), and lead/indium/silver, which can include higher percentages of lead or tin (up to 75%+/−17.5 or 20%, and 3-20% or preferably 5% indium and 1-5%, or 2.5+/−0.3% silver, all preceding percentages being % by weight), and the conductive element is a woven or non-woven wire mesh or perforated sheet of a conductive metal, including for example, copper, aluminum, brass, bronze, zinc, tin, silver and gold, with copper being a preferred material or other conductive particulate substance that is introduced into the annular space between the tube and the sleeve as the tube and sleeve are vibrated. The ends of the sleeve are typically sealed against the tube with compression rings that attach the sleeve at or near its ends to the tube and prevent the particulate fill material from leaking out of the annular space.

When the length of the sputter target is longer than that of the available sleeve of sputtering material, the sputter target can be made with a plurality of sleeves that are joined together around the support tube so that the end of one sleeve abuts the end of another. The ends of the two outer sleeves can be attached to the support tube with compression rings, other mechanical devices, such as flanges and threads, or adhesives.

In yet another embodiment, the invention relates to a method of bonding a sputtering target material to a backing tube comprising selecting a backing tube having an outer surface and preparing the outer surface by cleaning it and applying a support base; preparing a conductive element which is a conductive mesh by measuring the conductive mesh so that it is a size sufficient to overlay but not overlap the outer surface of the backing tube; and applying the conductive element to the outer surface of the backing tube; selecting at least one hollow sleeve of a target material which has an inner surface and preparing the inner surface by cleaning it; placing the wire mesh wrapped backing tube in a vertical position on the support base and placing the prepared hollow sleeve over the conductive mesh wrapped backing tube to form a radially symmetrical gap between the outer surface of the hollow sleeve and the inner surface of the backing tube, which gap is between from 0.02 to 0.06 inches in width and wherein the conductive mesh in in the gap; and filling the gap to at least 95% full by volume with a bonding material.

In this invention, the backing tube may comprise stainless steel or carbon composite, the target material may be is one or more of AZO, ITO, IGZO and IGTO, and the conductive mesh may be a woven wire mesh comprising copper, bronze, aluminum, zinc, silver, gold or graphite, and particularly may be copper wire mesh. Advantageously, the conductive element may be a mesh having from 50 to 100, or preferably 80+/−15 holes per inch, a wire diameter of from 0.002 to 0.02, and preferably 0.0055+/−0.002 inch, and an opening size of 0.0005 to 0.01 or 0.007+/−0.005 preferably inch. Additionally, the thermally conductive composite may have a thermal conductivity at room temperature above 80 W/mK+/−5 W/mK, and preferably above 150 W/mK+/−20 W/mK and an electrical conductivity above 8.0 ohm-cm+/−1 ohm-cm and preferably above 10.0 ohm-cm+/−1 ohm-cm.

In accordance with a further aspect, the invention includes the step of making the hollow sleeve of target material by isostatic pressing a milled material and heating it to form a hollow ceramic cylinder, and in addition, the backing tube comprise may comprise a hollow cylinder having a wall thickness between about 1.0 and about 8.0 millimeters and a length of from 1 meter to 4 meters.

BRIEF DESCRIPTION OF THE DRAWING

FIG. 1 is a side perspective view of an embodiment of a rotatable sputtering target in the context of a PVD device and in accordance with the invention;

FIG. 2 is a longitudinal cross-sectional view of the sputter target shown in FIG. 1 taken along the line 2-2;

FIG. 3 is an exploded view of the backing tube with a first target cylinder in place and showing the method of assembly;

FIG. 4 is a detail of the conductive element used in the rotatable sputtering target of the present invention;

FIG. 5 is a scan of a high thermal conductive bond of the sputtering target of the present invention;

FIG. 6 is a view of an adhesive test of the rotatable sputtering target of the present invention;

DETAILED DESCRIPTION OF THE INVENTION

Figure 7:
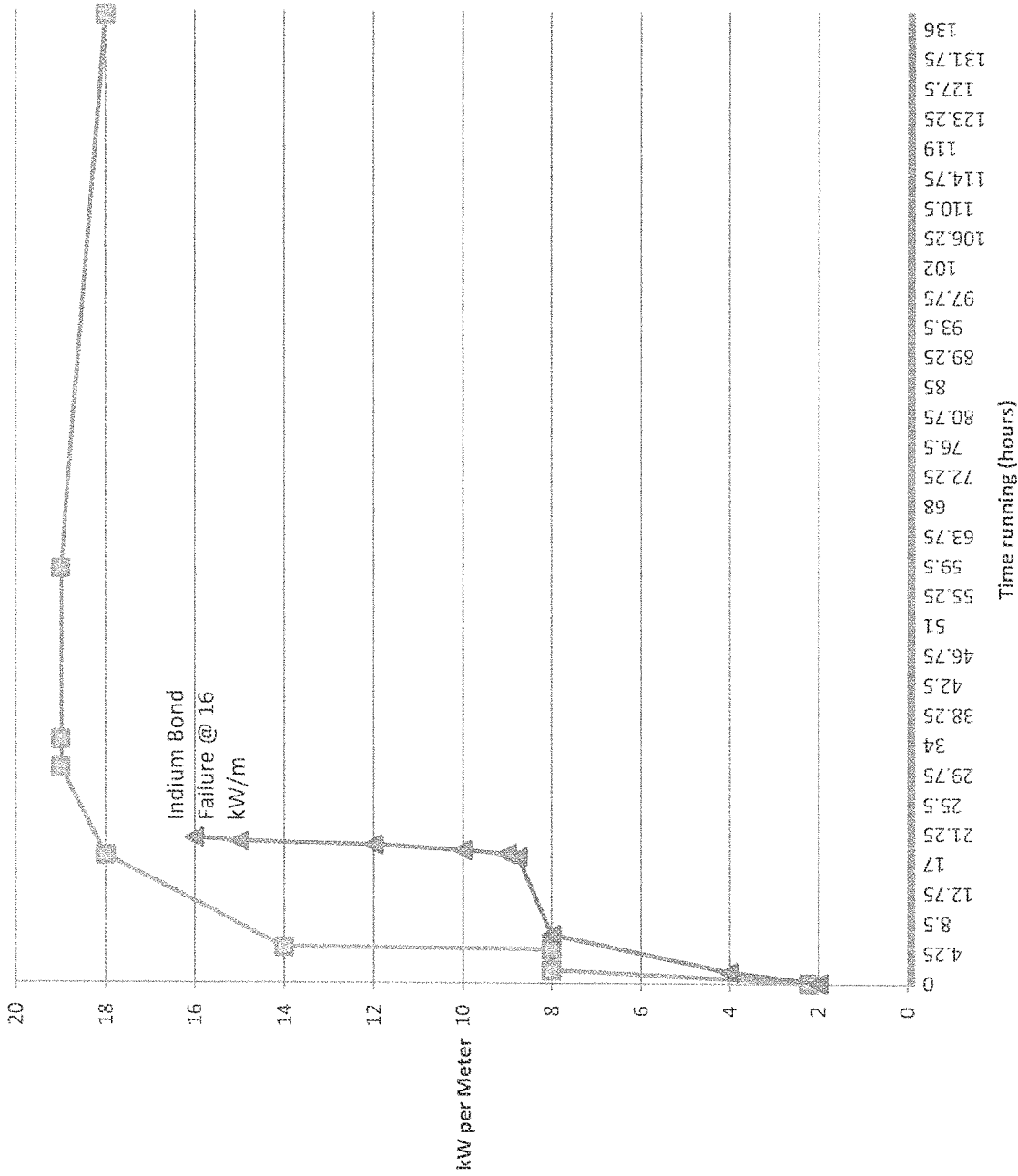
FIG. 7 is a plot showing bond integrity of the rotatable sputtering target of the present invention and showing a plot of a failed adhesion test using a target in accordance with the prior art.

FIGS. 1 and 2 in the drawing illustrate one embodiment of a sputter target 10 of the invention. The sputter target comprises a cylindrical hollow backing or support tube 12 that passes through the interior of target material sleeves or hollow cylinders 14 and 16 of sputtering material so as to form a radially symmetrical annular space or gap 18 that is preferably from 0.02 to 0.06 inches between at least portions of the outer surface of the backing tube and the inner surface of each of the cylindrical target sleeves. The annular space 18 is occupied by a thermally conductive bonding material 19 and a thermally and electrically conductive element, which in this case is a woven wire mesh that laps once around the outer surface of the backing tube, but does not overlap itself. The conductive element is a mesh having from 50 to 100, and preferably 80+/−15 holes per inch, and a wire diameter of from 0.002 to 0.02, and preferably 0.0055+/−0.002 inch and an opening size of 0.0005 to 0.01, and preferably 0.007+/−0.005 inch opening size. The sleeves are secured in place on the backing tube by compression rings 20.

The support tube 12 shown in the FIGS. 1 and 2 is made of a material having sufficient structural strength to enable it to carry the two sleeves of sputtering material as the sputter target is rotated inside a sputtering chamber during the sputtering process. Suitable materials include stainless steels and carbon-carbon composites. Typically, the tube is made of austenitic stainless steel. Normally, the support tube is a hollow cylinder having a wall thickness between about 1.0 and about 8.0 millimeters. The length of the support tube depends on the size of the sputtering equipment in which it is to be used and normally ranges from about 1.0 meter to about 4.0 meters. Typically, the tube is long enough to protrude from the outer ends of sleeves 14 and 16 so that at least one end of the tube can engage a mechanism used to rotate sputter target 10 in the sputtering chamber.

The sleeves 14 and 16 are made of the material that is desired as the coating for the substrates that are passed through the sputtering chamber. Normally, this sputtering material is a non-metal ceramic, with AZO, ITO, ITGO, AZIO being examples of the base material i.e., based on a metal oxide such as aluminum, zinc or indium oxide and including the option of various dopants in low percentages (i.e. from 0.005 to 5% by weight). The present invention is also applicable to ceramics, including complex ceramics; cermets; and metals; and for use in all sputtering or plasma coating applications; including roll to roll coating, glass, and e-glass coating applications.

Each sleeve 14 and 16 typically has a wall thickness between about 4.0 and 25 millimeters, normally between about 8.0 and 15 millimeters. The length of each sleeve depends on the length of the sputter target required to fit the sputtering equipment, the strength of the sputtering material from which the sleeve is fabricated, the ease of sleeve fabrication, and the number of sleeves used in constructing the target. For example, if the sleeve is made by isostatic pressing a hollow cylinder from a milled powder and the sputter target must fit relatively long sputtering equipment, a plurality of sleeves is normally used because the structural strength of the material and the machining process do not lend themselves to the use of a long single sleeve. On the other hand, if the sputtering equipment requires a relatively short target, the use of a single sleeve may be feasible.

Sleeves made of ceramics are usually no more than about 3.0 meters long and typically range between about 0.5 and 1.5 meters in length. In general, sleeves made of a metal can be longer than graphite sleeves. Although sputter target 10 is shown in FIG. 1 as comprised of 4 separate sleeves, other embodiments of the invention may employ one sleeve, three sleeves, four sleeves and even more if dictated by the sputtering material and the required length of the sputter target.

The sleeve 14 is normally connected to sleeve 16 so that the inner ends of both sleeves abut one another to form a somewhat continuous cylinder of sputtering material. One means of securing the sleeves at either end to the backing tube is to use joint ring 22.

Further in this invention a bonding material and conductive substrate or element are used to seal the annular space 18 between the inside of the target cylinders and the outside surface of the backing tube.

The annular space 18 that exists between portions of the inside surface of the sleeves 14 and 16 and portions of the outside surface of support tube 12 typically has a width "W" between about 0.005 to 0.1 inches, more typically between about 0.02 to 0.06 inches, and contains a thermally and electrically conductive bonding composite material 19, comprising a bonding material and a conductive element, and more specifically a copper mesh cylinder or surface finish. The conductive bonding material typically has a thermal conductivity at room temperature above 80 W/mK+/−5 W/mK and preferably above 100 W/mK+−10 W/mK, and more preferably above 150 W/mK+/−20 W/mK and an electrical conductivity above 8.0 ohm-cm+/−1 ohm-cm, and preferably above 10.0 ohm-cm+/−1 ohm-cm, and is typically indium.

The annular space 18 is typically filled with a sufficient amount of thermally conductive material 19 so that heat generated in the sputtering process is effectively conducted from the sleeves 14 and 16 to the cooled support tube 12 during sputtering. When a particulate material, such as a powder, is used in the annular space, at least about 90% volume percent of the space should be filled, but it is more typical that the composite bonding material occupy over 95%, and preferably over 97% volume percent of the space. Normally, essentially all of the annular space is filled when an adhesive is used as the fill material. The adhesive also typically serves to attach the sleeves to the support tube along with the compression rings. Normally, the material occupying the annular space is not a solder or braze and the sleeves are not welded to the support tube.

Usually, the material 19 occupying annular space 18 is a thermally and electrically conductive material. Examples of metals that can be used as the powder include stainless steel, silver, copper, gold, platinum, chrome and zinc. Additionally, it is envisioned that carbon, for example in the form of graphite, including powder, filings, wire and mesh, including in high loadings (for example above 45%, and more preferably above 50, 60, or 70% by weight) in a carrier or matrix of organic material.

Figure 8:
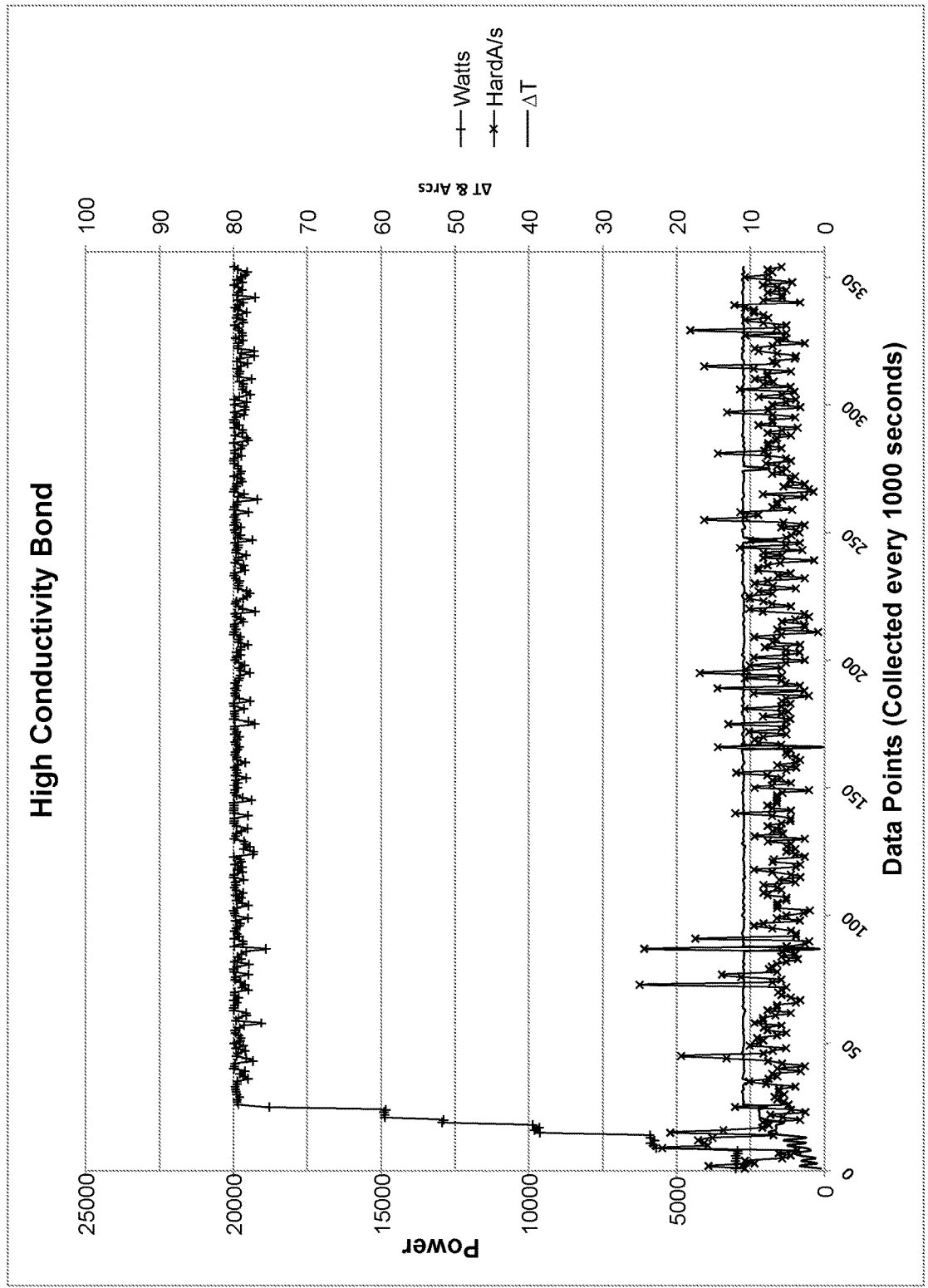
FIG. 8 is a plot showing bond integrity of a 1 meter rotatable sputtering target of the present invention showing extended run life without failure at 20 kW.
Figure 9:
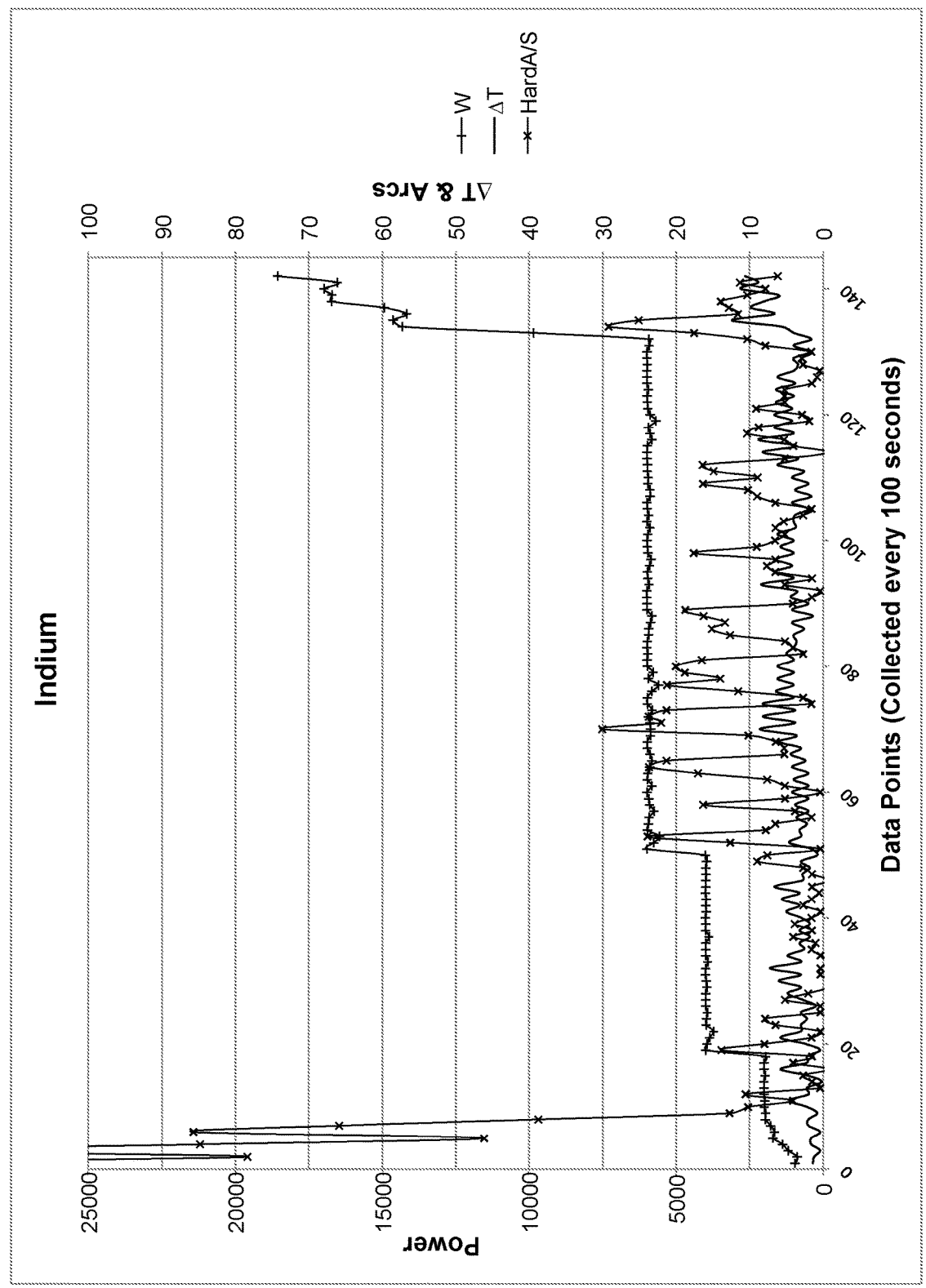
FIG. 9 is a plot showing bond integrity of a 1 meter rotatable sputtering target without the high density improvement of the present invention.

In fabricating the sputter target 10 of the invention, the support tube 12 is stood on one end and attached to a support base, not shown in the figures, to hold the sputter target upright as it is being assembled. A compression ring 20 is place over the top of support tube 12 and forced downward until it is at or near the bottom of the tube. The sleeve 14 is then placed concentrically over the top of the support tube and moved downward until it reaches the compression ring. The bottom end of sleeve 14 typically contains a precision bore extending into the sleeve between about 6.0 and about 16.0 millimeters so that the sleeve can be press fit over the compression ring and thereby attached to support tube 12 in such a manner as to form annular space 18. FIG. 8 shows this assembly.

A thermally and, preferably, an electrically conductive mesh 22 of an appropriate size to surround the OD of the backing tube, is then introduced around the backing tube so that it will be within the annular space 18 to create a conductive path between the sleeve 14 and support tube 12. Subsequently, after all of the target material cylinders which make up the sleeve are placed around the backing tube 12 and the conductive mesh 22, a bonding material 21 is introduced within the filled annular space 18. In order for the bonding material to be placed into the relatively small annular space, it must flow at the fabrication temperature, i.e., the temperature of the environment surrounding the sputter target as it is assembled. Typically, the conductive material is flowable at a temperature between about 156° C. and 250° C. To ensure that voids in the annular space are filled as the conductive material is introduced into the annular space 18, the support tube 12 and sleeve 14 are normally vibrated as the material is added. The sleeve 14 is held concentric to the support tube during vibration by one or more removable spacers typically located at the top of the sleeve.

The annular space formed between the sleeve 16 and support tube 12 is typically filled with the same flowable material used to fill the annular space between sleeve 14 and tube 12. Normally, the same filling procedure is followed, i.e., spacers are used to hold the sleeve 16 concentrically around the tube while the target assembly is vibrated and the flowable material is introduced into the annular space until it is substantially filled. The spacers are then removed, and any desired additional sleeves and joint rings are added over the tube in the same manner as described above. If no additional sleeves are needed to reach the desired length of the sputter target, a second compression ring 20 is forced over the tube and press fit into the precision bore at the top of sleeve 16. This second compression ring serves to seal the annular space and to attach the sleeve 16 to tube 12. Usually, a portion of the support tube 12 extends outward from the top of sleeve 16 about the same distance the support tube extends outward from the bottom of sleeve 14.

The assembled sputter target 10 is then removed from the support base, and used as the cathode in the sputtering equipment.

EXAMPLES

In accordance with the invention, two rotatable cylindrical sputtering targets using 133 mm backing tubes, and two bonded cylindrical AZO targets were made, one with a prior art type bond of pure Indium and a second with a high-density bond. The two targets were made as set forth below and tested using the same parameters except for the bond features and the test was run to failure which occurred at 16 KW/M for the prior art target and the second target ran to 19 KW/M and to 136 hours. The results of the tests for the two samples are shown in FIG. 7 where it is demonstrated that the high-density bond in accordance with the invention operates successfully at a higher wattage and for a far longer period of time.

In a further example, the test was run under the same conditions except that a target was made to complete a one meter bonded cylindrical AZO target, and the target successfully ran for an extended period of time, 97 hours, at 20 kW per meter without failure. The result of this test is shown in FIG. 8. In comparison a test was run without the high density bond of the present invention, but with the prior art Indium bond. This test failed on ramp before 15 kW per meter after approximately four hours.

The sputtering equipment used was an Angstrom Rotatable Target Test System. The ramp feature on the power supply was used to control the power input. Each new kW value was ramped to from the previous over 100 seconds. The base vacuum was 3E-5 and run vacuum was 6E-3. The water temperature input ranged from 20° C. to 30° C. (with cold morning temperatures vs later in the day) and the water output temperature from cathode cooling ranged from 27° C. to 40° C. The average delta T of 6.69° C. during high kW load (18 kW/m to 19 kW/m).

Preparation of High-Density Bond Rotatable Targets.

The process is started by preparing a 1.55 m 133 mm backing tube and six target cylindrical blanks which are 165.1 mm OD, 135.02 mm ID, and 250.39 mm in length. The backing tube and cylinders need to have clean and smooth mating surfaces and accordingly the ID of the target cylinders and the OD of the is cleaned to remove any debris. The conductive element is a 0.304 mm woven copper mesh material which is measured and cut to the OD of the backing tube so that the mesh won't overlap when it is the bonded and it cut the roll to 1500 mm length to keep the mesh neatly inside the bond.

Figure 10:
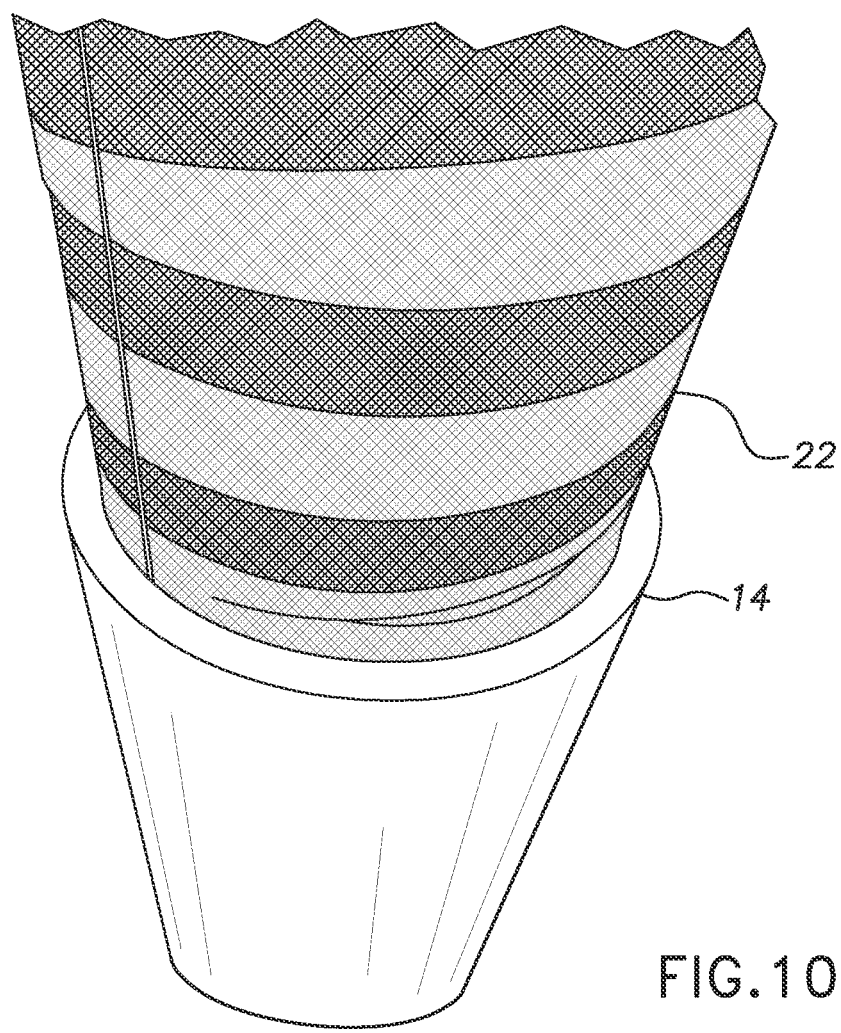
FIG. 10 is an illustration of the set up for the sputtering target in accordance with the invention.

The mesh is centered on the length of the backing tube and wrapped around the tube and a spiral of kapton tape (shown in FIG. 10 as the spiraling stripes where the woven mesh has a visible texture under that) is applied around the tightly positioned mesh to hold it in place, and ensuring that the tape does not overlap to assist removal later.

The backing tube is checked for defects and positioned on the bonding stand with the alignment tool is correctly installed on the bottom of the backing tube, and a target cylinder is selected and slid around the mesh and over the backing tube to a prescribed distance relative to the top of the alignment tool stop in order to remove the tape. A gasket is placed on the top of the target cylinder, and the previous steps are repeated for each additional cylinder until 6 cylinders have been assembled, checked for alignment and measured for offset (i.e., the distance between the top of the backing tube and the top of the 6th cylinder, which should measure 20 mm (+5 mm/−0 mm) The top clamping device is added to the assembly and a gasket clamping mechanism is applied around each cylinder to cylinder joint.

The assembly in a protective cloth and heater are applied, and the assembly is heated to the melting temperature of the bonding material being used, at which point the bonding material is added as a liquid, and physical energy is added to the assembly. Then the assembly, and in particular, the bond is cooled at a controlled rate to complete the bond.

While in accordance with the patent statutes, the best mode and preferred embodiment have been set forth, the scope of the invention is not limited thereto, but rather by the scope of the attached claims.

What is claimed is:

1. A sputtering target comprising:
a hollow backing tube having an exterior surface with an outside diameter;
at least one sleeve comprising a sputtering material, said sleeve having an interior surface with an inside diameter greater than the outside diameter of said tube and surrounding said tube so as to form an annular space between the outside surface of said tube and the inside surface of said sleeve which define a thickness n;
a thermally conductive bonding composite occupying said annular space and extending between the exterior surface of the backing tube and the interior surface of the sleeve,
wherein said thermally conductive composite comprises a bonding material which is one or more of indium, tin or silver or an alloy thereof and a conductive element which comprises a thermally conductive cylinder which comprises a woven wire mesh having a thickness less than n that laps once around the outer surface of the backing tube and does not overlap itself and including the bonding material within openings formed in the wire mesh.

2. The sputtering target as set forth in claim 1, wherein the woven wire mesh comprises copper, bronze, aluminum, zinc, silver, gold or graphite.

3. The sputtering target as set forth in claim 1, wherein n is 0.1 inch (2.54 mm) or less.

4. The sputtering target as set forth in claim 3, wherein n is 0.075 inch (1.905 mm) or less.

5. The sputtering target as set forth in claim 3, wherein n is 0.06 inch (1.5 mm) or less.

6. The sputtering target as set forth in claim 1, wherein the conductive element is a mesh having from 50 to 100, holes per inch, a wire diameter of from 0.002 to 0.02 inch, and an opening size of 0.0005 to 0.01 inch.

7. The sputtering target as set forth in claim 6, wherein the conductive element is a woven metal mesh having 80+/−15 holes per inch, and a wire diameter of 0.0055+/−0.002 inch, and an opening size of 0.007+/−0.005 inch and wherein the thermally conductive composite has a thermal conductivity at room temperature above 80 W/mK+/−5 W/mK and an electrical conductivity above 8.0 ohm-cm.+/−1 ohm-cm.

8. The sputtering target as set forth in claim 7, wherein the thermally conductive composite has a thermal conductivity at room temperature above 100 W/mK+/−10 W/mK and an electrical conductivity above 10.0 ohm-cm+/−1 ohm-cm.

9. The sputtering target as set forth in claim 1, wherein the backing tube is comprised of one or more of stainless steel and carbon composite and having a wall thickness between about 1.0 and about 8.0 millimeters and a length of from 1 meter to 4 meters and wherein the sleeve comprises a ceramic.

10. The sputtering target as set forth in claim 9, wherein the sleeve comprises one or more of AZO, ITO, ITGO, AGZO and the optionally one or more dopant percentages at from 0.005 to 5% by weight.

11. The sputtering target as set forth in claim 10, wherein the sleeve is made by isostatic pressing a milled powder.

12. The sputtering target as set forth in claim 1, wherein the sleeve has a wall thickness between about 4.0 and 25 millimeters.

13. The sputtering target as set forth in claim 1, wherein the sleeve is comprised of a plurality of assembled sleeves and the sputtering target has a length of between 0.5 and 1.5 meters.

14. A rotatable sputtering device comprising
a sputtering enclosure,
a plasma source,
and a sputtering target mounted within the sputtering chamber and operatively linked to a drive mechanism which is capable of rotating the sputtering target and the sputtering target comprising a cylindrical backing tube and at least one cylindrical sleeve comprising a ceramic sputtering material, said sleeve having an inside surface with an inside diameter greater than the outside diameter of said tube and surrounding said tube so as to form an annular space between the outside surface of said tube and the inside surface of said sleeve which define a thickness n; a thermally conductive bonding composite occupying said annular space, and wherein said thermally conductive composite comprises an indium material and a conductive element which comprises a thermally conductive metal cylinder comprised of a wire mesh having a thickness less than n and including openings and the iridium material being bonded to the wire mesh including through the openings and to the inside surface of the ceramic sputtering material and the outside surface of the cylindrical backing tube.

15. A rotatable sputtering device for use in manufacture of a coated glass comprising
a sputtering enclosure including a substrate for the manufacture of the coated glass,
a plasma source,
and a sputtering target mounted within the sputtering chamber and operatively linked to a drive mechanism which is capable of rotating the sputtering target and the sputtering target comprising a cylindrical backing tube and at least one cylindrical sleeve comprising a ceramic sputtering AZO or ITO material, said sleeve having an inside diameter greater than the outside diameter of said tube and surrounding said tube so as to form an annular space between the outside surface of said tube and the inside surface of said sleeve which define a thickness n from 0.02" and −0.08" inch; and a thermally conductive bonding composite at least partially occupying said annular space, and wherein said thermally conductive composite comprises a bonding material which comprises one or more of indium, silver, and tin, and a conductive element which comprises a woven wire mesh.

16. A sputtering target comprising:
a cylindrical metal backing tube having an outside surface with an outside diameter;
at least one cylindrical sleeve comprising a ceramic, cermet or metal sputtering material, said sleeve having an inside surface with an inside diameter greater than the outside diameter of said tube and surrounding said tube so as to form an annular space between the outside surface of said tube and the inside surface of said sleeve which define a thickness n;

a thermally conductive bonding composite occupying said annular space and being bonded to the inside surface and the outside surface, wherein said thermally conductive composite comprises an indium bonding material and a conductive element which comprises an intermediate thermally conductive woven wire mesh liner having a thickness less than n is 0.1 inch or less and includes openings and wherein the woven wire mesh comprises copper, bronze, aluminum, zinc, silver, gold or graphite and is bonded with the metal backing tube and the cylindrical sleeve by the indium bonding material which also extends through the openings of the woven wire mesh liner.

17. The sputtering target as set forth in claim 16, wherein the backing tube has an outer surface and the conductive element is a wire mesh that laps once around the outer surface of the backing tube and does not overlap itself.

18. The sputtering target as set forth in claim 17, wherein the conductive element is a mesh having from 50 to 100, holes per inch, a wire diameter of from 0.002 to 0.02 inch, and an opening size of 0.0005 to 0.01 inch and wherein the thermally conductive composite has a thermal conductivity at room temperature above 80 W/mK+/−5 W/mK and an electrical conductivity above 8.0 ohm-cm.+/−1 ohm-cm.

\* \* \* \* \*